(12) United States Patent
van der Veen et al.

(10) Patent No.: US 6,455,862 B1
(45) Date of Patent: Sep. 24, 2002

(54) LITHOGRAPHIC PROJECTION APPARATUS

(75) Inventors: Paul van der Veen, Eindhoven (NL); Oscar F. J. Noordman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/461,275

(22) Filed: Dec. 14, 1999

(30) Foreign Application Priority Data

Dec. 16, 1998 (EP) .............................. 98204268

(51) Int. Cl.$^7$ .............................. A61L 5/00; G21G 5/00; G03B 27/42
(52) U.S. Cl. ...................... 250/492.2; 355/53
(58) Field of Search ............................. 355/53; 430/30, 430/5; 378/34; 359/355, 208; 364/468.28; 250/492.2

(56) References Cited

U.S. PATENT DOCUMENTS

| | | | |
|---|---|---|---|
| 5,138,368 A | * 8/1992 | Kahn et al. | 355/53 |
| 5,673,101 A | * 9/1997 | Tenner et al. | 355/53 |
| 5,828,573 A | * 10/1998 | Hayashi | 364/468.28 |
| 5,973,826 A | * 10/1999 | Chapman et al. | 359/355 |
| 6,015,644 A | * 1/2000 | Cirelli et al. | 430/30 |
| 6,103,428 A | * 8/2000 | Hatai et al. | 430/5 |
| 6,208,707 B1 | * 3/2001 | Oshino | 378/34 |
| 6,218,057 B1 | * 4/2001 | Cirelli et al. | 430/5 |
| 6,226,346 B1 | * 5/2001 | Hudyma | 378/34 |
| 6,262,826 B1 | * 7/2001 | Shafer | 359/208 |
| 6,280,906 B1 | * 8/2001 | Braat et al. | 430/296 |

FOREIGN PATENT DOCUMENTS

EP     1 014 429 A1     6/2000

OTHER PUBLICATIONS

Leclerc et al, "Luminescence and transient absorption bands in fused SiO2 induced by KrF laser radiation at various temperatures", reprinted from Journal of Non-crystalline Solids, 149 (1992), pp. 115–121.

* cited by examiner

Primary Examiner—John R. Lee
Assistant Examiner—Johnnie L Smith, II
(74) Attorney, Agent, or Firm—Pillsbury Winthrop LLP (57) ABSTRACT

A lithographic projection apparatus having a radiation system LA, Ex, IN, CO for supplying a projection beam PB of electromagnetic radiation; a mask table MT provided with a mask holder for holding a mask MA; a substrate table WT provided with a substrate holder for holding a substrate W; a projection system PL for imaging an irradiated portion of the mask MA onto a target portion C of the substrate W. The electromagnetic radiation has a wavelength less than 200 nm, and the apparatus also has a control device for maintaining the energy dose $D_s$ at substrate level at a substantially constant value, by substantially compensating for irradiation-induced drift in the intensity $I_s$ at substrate level.

12 Claims, 4 Drawing Sheets

LITHOGRAPHIC PROJECTION APPARATUS

BACKGROUND OF THE INVENTION

1. Field of the Invention

The invention relates to a lithographic projection apparatus having a radiation system for supplying a projection beam of electromagnetic radiation; a mask table provided with a mask holder for holding a mask; a substrate table provided with a substrate holder for holding a substrate; a projection system for imaging an irradiated portion of the mask onto a target portion of the substrate.

2. Description of Related Art

An apparatus of this type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies that are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. More information with regard to lithographic devices as here described can be gleaned from International Patent Application WO 97/33205.

Up to very recently, apparatuses of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine The lithographic projection equipment most commonly used today operates at an exposure wavelength of 365 nm (so-called i-line apparatus) or 248 nm (so-called DUV apparatus). However, the ever-decreasing design rules in integrated circuitry have created a demand for even smaller exposure wavelengths $\lambda$, since the resolution that can be attained with lithographic equipment scales inversely with $\lambda$. Consequently, much research has been devoted to finding new light sources operating at wavelengths shorter than 248 nm. Currently, attention is being focused on new wavelengths that can be produced by excimer lasers, such as 193 nm, 157 nm and 126 nm, and researchers hope that such lasers can be refined so as to produce sufficient intensity for lithography purposes (so as to guarantee adequate throughput). In this context, it should be noted that currently available i-line equipment generally employs a mercury lamp with a power of the order of about 3–5 kW, whereas DUV apparatus typically uses excimer lasers with a power of the order of about 5–10 W, or even higher. The intensity demands on the new-wavelength excimer lasers are therefore very high.

The assignee of the current patent application recently announced the successful development of the world's first fully functional, wide-field, production-level lithographic projection apparatus operating at 193 nm; up to that point, only relatively primitive test tools operating at 193 nm had been available. The introduction of this apparatus was preceded by intense research efforts into source development, illuminator design, and lens materials. During this research, an important difference was observed between the new 193-nm machine and existing 248-nm devices, as will now be discussed.

In experiments leading to the invention, the inventors observed that intense radiative fluxes of 193-nm light caused transient changes in the characteristics of refractive materials placed in their paths (for example, quartz or $CaF_2$ lens elements). Moreover, the same effect was observed by the inventors to occur in various optical coatings present on lenses or mirrors located in the optical path. These changes were observed to affect, for example, the transmissivity of the projection system, thus altering the radiation intensity received at the substrate, even if the intensity delivered by the radiation system (excimer laser) was kept constant; consequently, such effects could cause serious exposure errors on the substrate (e.g. under-exposure of a resist layer). To make matters worse, the inventors observed that these transmissivity changes demonstrated a complex temporal dependence.

Typically, an apparatus as described in the opening paragraph will additionally comprise one or more intensity (energy) sensors. For example, at a test position prior to the mask, it is possible to divert a small portion of the radiation in the projection beam out of the main path of the beam and onto an intensity sensor, thus allowing continual monitoring of the intensity produced by the radiation system. Similarly, it is possible to provide the upper surface of the substrate table with an intensity sensor, located outside the perimeter of the substrate; such a sensor can then be used to calibrate the apparatus on a regular basis, by allowing periodic comparisons of the intensity produced by the radiation system and the actual intensity $I_s$ received at the substrate. In analogy to the effects described in the previous paragraph, the inventors discovered that the sensitivity of such sensors could demonstrate a significant temporal drift as a result of irradiation with 193-nm radiation, resulting in intrinsic errors in the intensity measured at substrate level. Needless to say, if there is a (variable) intrinsic error in $I_s$ as a result of such sensitivity drift, this will result in a miscalibration of the apparatus, with the attendant risk of exposure errors.

In the case of radiation wavelengths at or above 248 nm, the effects described in the previous two paragraphs have hitherto not been observed. However, in the case of machines operating at 193 nm, these effects can be very serious. For example, in investigative experiments, the inventors observed that, in the case of a step-and-scan test apparatus employing a 5W ArF laser (193 nm) and various optical components comprising quartz and/or $CaF_2$ elements (inter alia a fly-eye lens or light mixing rod, lenses near the reticle masking blades, the main projection lens, etc.) the transmission T along the path of the radiation (between the laser and the substrate table) decreased by as much as 5–7% within 2–3 minutes of initiating irradiation, and then slowly relaxed upward once more (within a time of the order of about 5 minutes) when irradiation was interrupted (or set to another level). Moreover, differences in amplitude and temporal behavior were observed for different optical materials and material combinations. Such large transmission changes can cause serious dose errors at substrate level, with the possibility of large numbers of substrate rejects (particularly in IC manufacture).

SUMMARY OF THE INVENTION

It is an object of the invention to alleviate these problems.

This and other objects are achieved in an apparatus as specified in the opening paragraph, characterized in that the electromagnetic radiation has a wavelength less than 200 nm, and that the apparatus further comprises means for maintaining the energy dose $D_2$ at substrate level at a substantially constant value, by substantially compensating for irradiation-induced drift in the intensity $I_s$ at substrate level.

For the sake of clarity, the following definitions will be adhered to throughout this text:

1. Intensity $I_s$ is the energy $E_s$ per unit time t received at substrate level ($E_s = I_s \times t$). This will generally be a measured or derived value.
2. Dose $D_s$ is the amount of radiative energy transferred by the projection beam at substrate level in a specific time-interval $t_s$ ($D_s = I_s \times t_s$). Unless otherwise stated, $t_s$ will be taken to be the exposure time $t_e$, i.e. the length of time for which a single target area (die) on the substrate is (planned to be) exposed to a radiative flux during a given batch of exposures.

In experiments leading to the invention, the inventors fired a pulsed ArF laser beam through optical elements comprising quartz and/or $CaF_2$. It was found that, as the duty cycle, energy and/or frequency of the laser pulses was varied, the radiative intensity I transmitted through the optical elements also varied. Alternatively, if pulses of a constant duty cycle were fired through the elements for an extended period of time (minutes), then the value of I was seen to undergo a gradual decay towards an asymptotic value which was about 5–7% below the starting value $I_o$. This behavior appeared to be a complicated function of many parameters, such as time, the energy, length and frequency of the laser pulses, and the previous "irradiation history" of the optical elements (a sort of hysteresis effect). However, after much analysis, the inventors were able to model this behavior on the basis of a set of equations (see Embodiment 2, for example). Accordingly, it became possible to predict the ratio $I/I_o$ that would be observed at a particular point in an irradiation cycle, on the basis of the previous "history" of that irradiation cycle.

Once such a prediction could be made with relatively good accuracy, the possibility of correcting such transient changes in $I/I_o$ became tangible. Since a reliable prediction was now available, the inventors chose a feedforward correction (anticipatory measure) instead of a feedback correction (reactive measure), inter alia because the latter would necessarily incur a greater time penalty than the former.

According to the invention, the inventors have devised several different ways of achieving the correction according to the invention, which can be used individually or in combination. These can be further elucidated as follows:

(a) It is possible to adjust the intensity output of the radiation system, e.g. by altering the amplitude of the pulses produced by a pulsed laser source, or by adjusting the pulse frequency of that source.

(b) It is possible to dispose a variable filter at some point between the radiation system and the substrate (e.g. in the illuminator, or above the mask), and to use this filter to vary the intensity reaching the substrate. Such a filter may, for example, take the form of a partially transmissive optical element, whose transmissivity T is a function of the angle of incidence θ of incoming radiation; by varying θ, it is then possible to vary T (c) It is possible to adjust the exposure time $t_e$. A drift tendency in $I_s$ is then counterbalanced by imposing an inverse tendency on $t_e$, so as to keep $D_s$ substantially constant.

(d) In the case of a step-and-scan apparatus (as opposed to a conventional waferstepper), there is yet another manner in which to perform the correction according to the invention. Such a step-and-scan apparatus additionally comprises:
 a first driving unit for moving the mask table in a given reference direction parallel to the plane of the table;
 a second driving unit for moving the substrate table with a speed v (the so-called scanning speed) parallel to the reference direction so as to be synchronous with the motion of the mask table. The corrective method is then characterized in that irradiation-induced drift in $I_s$ is counteracted by appropriate variation of the scanning speed v, so as to keep $D_s$ substantially constant.

A great advantage of methods (c) and (d) with respect to method (a), for example, is that methods (c) and (d) generally allow correction of a wider range of fluctuations in $I_s$, without having to disturb the laser from its optimum operating state. In accordance with the invention, the lower the value of $I_s$, the higher the value of $t_e$ (method (c)) or the lower the value of v (method (d)) which has to be chosen, and vice versa; in this way, although the intensity $I_s$ may change at substrate level, the radiative dose $D_s$ at that level will remain substantially constant.

In general, the inventors have found that, in exposing a Si wafer (e.g. a 20-cm wafer) with a plurality of dies (e.g. of the order of about 100–200 dies), a significant change in $I_s$ (e.g. of the order of a few percent) can occur between exposure of the first and last die. However, during exposure of any single die, the variation in $I_s$ is typically small (e.g. of the order of about 0.1–0.5%) and may be neglected in many cases without causing serious dose errors. In general, this means that it will usually be sufficient to assess $I_s$ and take corrective measures (as in methods (a)–(d) above) just before exposure of each die or (small) group of dies, the value of the correction remaining constant during that particular exposure. Nevertheless, if it is necessary or desirable to further limit the effect of irradiation-induced drift during a single exposure, then the invention also allows adjustments to the degree of correction during the course of any given exposure ("intra-die" correction).

According to the invention, a distinction can be made between a basic feedforward correction method and a number of possible extensions that can help to further improve the performance of the inventive apparatus. For example:

A basic method can be completely based on a model that describes the transient effects. In such a case, there is no attempt to update correction parameters (e.g. by using intermediate auto-calibrations against a reference) so as to take the actual momentary transmission of the optics into account. This can be referred to as a "static method";

An extension to such a basic method is to use a regular auto-calibration to make adjustments for deviations between the outcome of the said model and the measured (actual) transmission status. This can be referred to as a "dynamic method";

In a further extension of this dynamic method, the result of the auto-calibration is used to fine tune one or more parameters of the said model. Consequently, slow changes in the behavior of the transient effects during use of the apparatus (e.g. caused by deteriorations in the optical materials) can be automatically corrected by appropriate adjustment of model parameters. This can be referred to as a "dynamic method with learning effect".

Due to the transient transmission variation described above, it will be desirable from time to time to perform a relative calibration of the energy sensors $E_1$ and $E_2$. If such a calibration is performed at zero order, it will have to be done in the absence of a reticle on the mask table. In current machines, this would entail removal of the reticle from the mask table, which is time-consuming and therefore incurs a throughput penalty. A more elegant approach proposed by the inventors is the provision of a small through-hole in the mask table, outside the area of the mask; in this scenario, one only has to move the mask table so that the through-hole is positioned in the projection beam, thus allowing radiation to reach the sensor $E_2$ without traversing a reticle. in this way, it becomes unnecessary to remove the reticle from the mask table in order to perform a zero-order calibration.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

It should be noted that an article by N. Leclerc et al. in J. Non-Crystalline Solids 149 (1992), pp 115–121, reports the occurrence of transient transmission degradation in high-OH fused silica cubes when irradiated with 215-nm radiation. The article does not, however, report similar effects in $CaF_2$, or in optical coatings on optical elements, or in energy sensors, it does not report any specific work on the complex optical systems used in lithographic devices, and does not recognize the potentially grave consequences for dose control and product quality in the use of such equipment for IC manufacture using high-intensity 193-nm radiation. Neither does the article seek to model the observed effects for the purpose of performing a correction, nor suggest a corrective feedforward as here elucidated.

The extensive research performed by the inventors at 193 nm has led them to postulate that similar trouble with transient effects will occur in lithographic projection apparatuses operating at 157 nm or 126 nm.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its attendant advantages will be further elucidated with the aid of exemplary Embodiments and the accompanying schematic drawings, whereby.

In the Figures, corresponding reference symbols refer to corresponding parts.

DETAILED DESCRIPTION OF THE PREFERRED EMBODIMENTS

Embodiment 1

Figure 1:
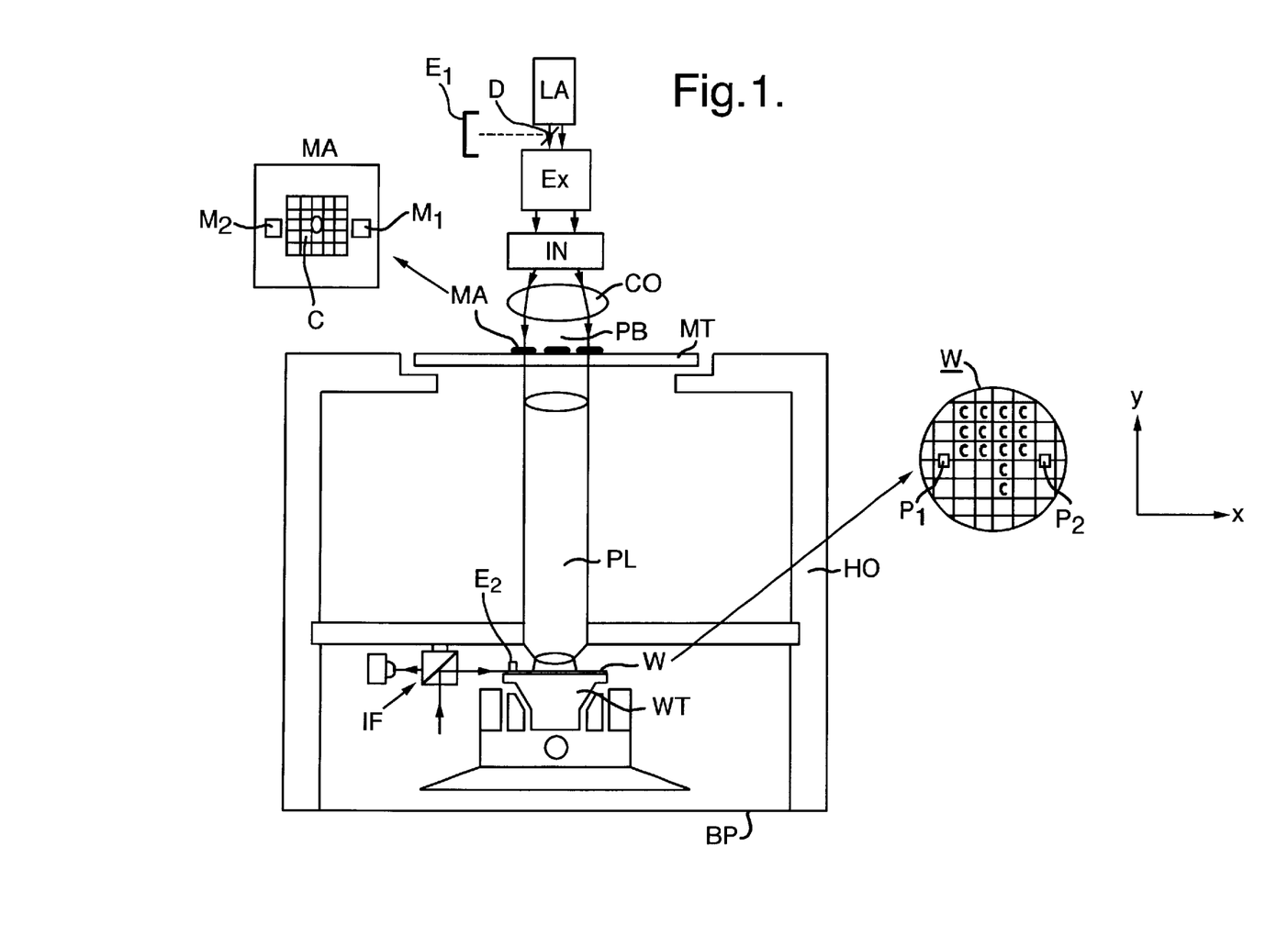
FIG. 1 schematically depicts a lithographic projection apparatus according to the invention.

FIG. 1 schematically depicts a lithographic projection apparatus according to the invention. The apparatus comprises:

a radiation system LA, Ex, IN, CO for supplying a projection beam PB of radiation (e.g. ultraviolet light with a wavelength of 193 nm, 157 nm or 126 nm);

a mask table MT provided with a mask holder for holding a mask MA (e.g. a reticle);

a substrate table WT provided with a substrate holder for holding a substrate W (e.g. a resist-coated silicon wafer);

a projection system PL (e.g. a lens or catadioptric system, or a mirror group) for imaging an irradiated portion of the mask MA onto a target portion C (die) of the substrate W.

The radiation system comprises a source LA (e.g. an excimer laser) which produces a beam of radiation.-This beam is passed along various optical components,—e.g. beam shaping optics Ex, an integrator IN and a condenser CO—so that the resultant beam PB has a desired shape and intensity distribution throughout its cross-section. For example, the beam cross-section may take the form of a uniform disc or annulus, or a multipole configuration (such as quadrupole or dipole).

The beam PB subsequently intercepts the mask MA which is held in a mask holder on a mask table MT. Having passed through the mask MA, the beam PB passes through the projection system PL, which focuses the beam PB onto a target area C of the substrate W. With the aid of the interferometrically controlled displacement and measuring means IF, the substrate table WT can be moved accurately, e.g. so as to position different target areas C in the path of the beam PB.

The apparatus is further provided with two energy sensors $E_1$, $E_2$. In the case of sensor $E_1$, deflecting means D (such as a partially reflective optical component, for example) are used to divert a portion of the radiation in the projection beam out of the main path of that beam and towards the off-axis sensor $E_1$; accordingly, this sensor $E_1$ can be employed as a continual monitor of the intensity being emitted by the source LA. On the other hand, sensor $E_2$ is mounted on the side of the substrate table WT which faces the beam PB, outside the perimeter of the substrate W itself; with the aid of the means IF, this energy sensor $E_2$ can be moved from time to time so that it intercepts the beam PB, thus allowing a regular calibration measurement of the actual value of $I_s$ (or $E_s$) at the level of the substrate W.

The depicted apparatus can be used in different modes:

In step mode, the mask table MT is fixed, and an entire mask image is projected in one go (i.e. a single "flash") onto a target area C. The substrate table WT is then shifted in the x and/or y directions so that a different target area C can be irradiated by the (stationary) beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PL (typically, M=¼ or ⅕). In this manner, a relatively large target area C can be exposed, without having to compromise on resolution.

During operation of the depicted apparatus, the radiation intensity $I_s$ at substrate level demonstrates an irradiation-induced drift. This is due, for example, to transient changes in the transmissivity of one or more of the optical elements Ex, IN, CO, PL, caused by intrinsic changes in the refractive material (main body) of these elements and/or the optical coatings with which they are generally provided; alternatively or concurrently, the sensitivity of one or both of the energy sensors $E_1$, $E_2$ can undergo a transient change, causing inaccurate correlation of $I_s$ with the intensity produced by the source LA (since the derived value of $I_s$ no longer corresponds to the actual value of $I_s$). During exposure of a given substrate W, or a batch of substrates, such drift can lead to serious exposure errors (dose errors), whereby one or more target areas C may undergo substantial under- or over-exposure.

The invention circumvents these effects by using a model to predict the drift in $I_s$ at any time t during use of the apparatus, and automatically compensating for this drift, e.g. using one or more of the methods (a)–(d) elucidated above.

Embodiment 2

The considerations which follow describe the basic structure of a model which can be used to predict the transmission T of (the components of) an optical system (e.g. the apparatus depicted in FIG. 1) as a function of time t.

The transient model used will in general satisfy the following defining equations:

$$\frac{\partial T\_tr(t)}{\partial t} = -\frac{T\_tr(t)}{\tau} \quad (3.2)$$

$$\Delta T\_tr = const. E_p \quad (3.3)$$

The transmission T is described by a fixed part $T_0$ and a transient term $T\_tr$, as in equation (3.1). The influence of time t on $T\_tr$ is given by equation (3.2), in which $\tau$ is a temporal constant. The impact of a single laser pulse with energy Ep incident on the optics is given by equation (3.3).

Performing a calculation of the transient part of the transmission can be done as in the following example.

It is assumed that the last known value for $T\_tr$ was calculated at $t=t_0$, and had a value $T\_tr\_0$. If a burst (train) of N pulses with energy Ep is incident on the optics, starting at $t=t_1$, then the following calculation steps must be performed in order to calculate the average transmission during the burst.

1) From $t=t_0$ to $t=t_1$: no light was passed through the optics. $T\_tr\_0$ then evolves according to equation (3.2) only. This differential equation must be solved numerically from $t_0$ to $t_1$. This can done by taking discrete steps in time $\Delta t$, so that the differential equation becomes a difference equation.

$$T\_tr_{n+1} = T\_tr_n - \frac{T\_tr_n}{\tau} \cdot \Delta t \quad (3.4)$$

2) From $t=t_1$ to $t=t_2$: N pulses are passed through the optics. The transient effect $T\_tr\_1$ at the beginning of the burst now evolves according to both equations (3.2) and (3.3). Solving equation (3.3) for each laser pulse is generally not necessary; calculations can be performed with $\Delta N$ pulses at the same time. The calculations must be repeated until the effect of all N pulses has been determined. In addition to calculating the influence of the laser pulses, the influence of time must also be taken into account. If $\Delta N$ pulses correspond to a time interval $\Delta t$ ($\Delta t = \Delta N/f$, where f is the pulse frequency of the laser), then both effects can be calculated simultaneously, as in equation (3.5).

$$T\_tr_{n+1} = T\_tr_n + const \cdot E_p \cdot \Delta N - \frac{T\_tr_n}{\tau} \cdot \Delta t \quad (3.5)$$

The result of the calculations is the value of the transient part of the transmission at the beginning ($T\_tr\_1$) and the end ($T\_tr\_2$) of the burst of N pulses. The resulting output variables of the calculations are calculated/defined as follows $$T\_tr_{average} = \frac{T\_tr\_1 + T\_tr\_2}{2} \quad (3.6)$$

$$T\_tr_{slope} = \frac{T\_tr\_2 + T\_tr\_1}{N} \qquad (3.7)$$

After the calculations have been completed, the last known value of T_tr (T_tr_2) and its corresponding temporal coordinate ($t_2$) must be stored. When a subsequent burst of pulses is incident on the optics, this value of T_tr is used as input for the calculations.

The accuracy and speed of these calculations depends on the size of the discrete steps $\Delta t$ and $\Delta N$. For smaller steps, the calculations are more accurate, but also generally slower. In general, a compromise between speed and accuracy should be sought.

Embodiment 3

Irradiation-induced drift in the sensitivity of the sensors $E_1$ and/or $E_2$ can be described using essentially the same model presented in Embodiment 2. In that case, the transmission "T" should be replaced by the term quantifying the sensitivity of the sensor in question.

Embodiment 4

According to the invention, an automatic calibration procedure can be used inter alia to:

correct any (small) residual discrepancies between the predictions of a (basic) model and the actual situation;
 additionally correct any relatively slow contributions to the irradiation-induced drift in the apparatus (e.g. caused by gradual degradation of optical coatings with time). During such an auto-calibration, the respective signals $S_1$, $S_2$ from the energy sensors $E_1$, $E_2$ are measured. These signals can then be used in the following calculations.

$$S_{2corr} = TCF_2 \times S_{2conv} \times S_2 \qquad (4.4)$$

$$S_{1corr} = TCF_o \times (S_{1conv})_{old} \times S_1 \qquad (4.5)$$

wherein:

the subscript "corr" indicates a corrected value;
 $S_{1conv}$ and $S_{2conv}$ are conversion factors for sensors $E_1$ and $E_2$, respectively;
 the subscript "old" refers to a previous value which is used in a new iteration;
 TCF is a Transients Correction Factor. This is a number which represents an overall correction factor for transient effects, and expresses a relative change with respect to some well-defined state of the system (e.g. more than 30 minutes without using the source LA). In the calculations here, the factor is the average correction factor over a burst of laser pulses. $TCF_2$ refers specifically to transient effects in the sensitivity of the sensor $E_2$, whereas $TCF_o$ refers to transient effects in the whole system between the source LA and the substrate table WT.

The result of the auto-calibration is that the ratio between the corrected signals from sensors $E_1$ and $E_2$ will be (re)set to 1. This is realized by adjusting the conversion factor $S_{1conv}$ for sensor $E_1$, the new value $(S_{1conv})_{new}$ being determined as follows:

$$(S_{1conv})_{new} = S_{2corr} / (TCF_o \times S_1) \qquad (4.6)$$

The difference with respect to the previous auto-calibration (without taking into account any transient effects) is that the correction factor $TCF_o$ is present. Equation (4.6) can also be written as follows:

$$(S_{1conv})_{new} = (S_{2corr}/S_{1corr}) \times (S_{1conv})_{old} \qquad (4.7)$$

It should be noted that the factor $S_{2conv}$ can be determined on the basis of a calibration experiment using a (semi-) standard reference radiation meter (e.g. as supplied by the company Ophir, Israel). Once $S_{2conv}$ is known, this can then be used to determine $S_{1conv}$, $TCF_2$ and $TCF_o$ in subsequent calibration experiments. All of these values can be stored in a memory device, where they can be accessed and updated by processor unit employed to enact the corrective procedures according to the invention.

Embodiment 5

Figure 2A:
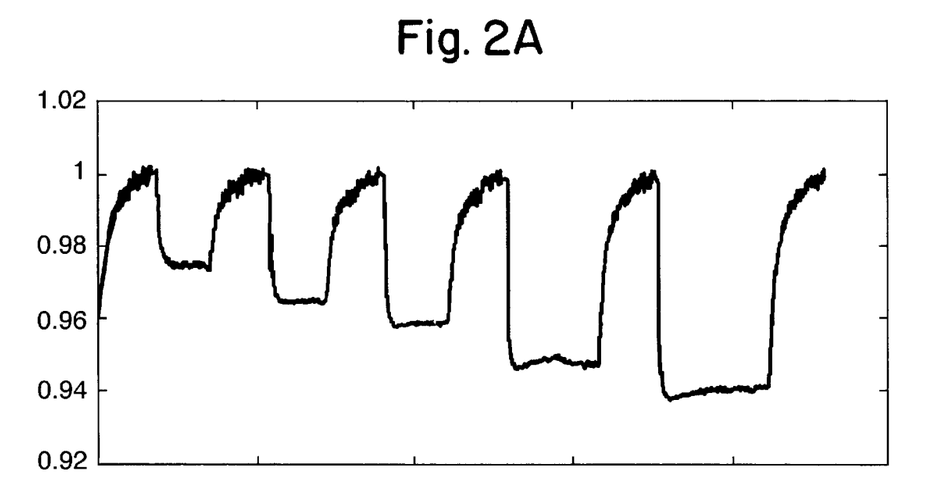
FIGS. 2A and 2B give a graphical rendition of the irradiation-induced drift in the intensity at substrate level resulting from various irradiation sessions performed during test experiments.
Figure 2B:
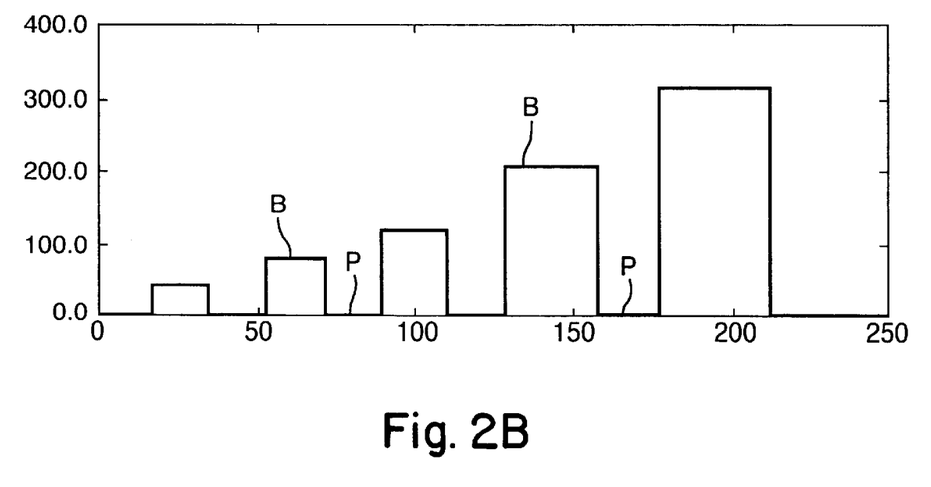

FIG. 2 gives a graphical depiction of the irradiation-induced drift in the intensity at substrate level resulting from various irradiation sessions performed during test experiments. The lower portion of the Figure is a graph of duty cycle [pulses/second] versus time [minutes] for a number of radiation bursts B fired successively from a pulsed laser (such as source LA in FIG. 1) with intervening pauses P; the upper portion of the Figure is a graph of $E_2/E_1$ for the same time axis, and serves as a measure of the transmission T of the optical elements Ex, IN, CO, PL shown in FIG. 1. From FIG. 2, it is evident that:

initiating irradiation produces a relatively sharp decline in $E_2/E_1$;
 ceasing irradiation causes an exponential-like relaxation of $E_2/E_1$ towards its initial value;
 the relative change in $E_2/E_1$ is roughly proportional to the duty cycle, which, in this case, is a measure of the irradiation intensity.

Figure 3:
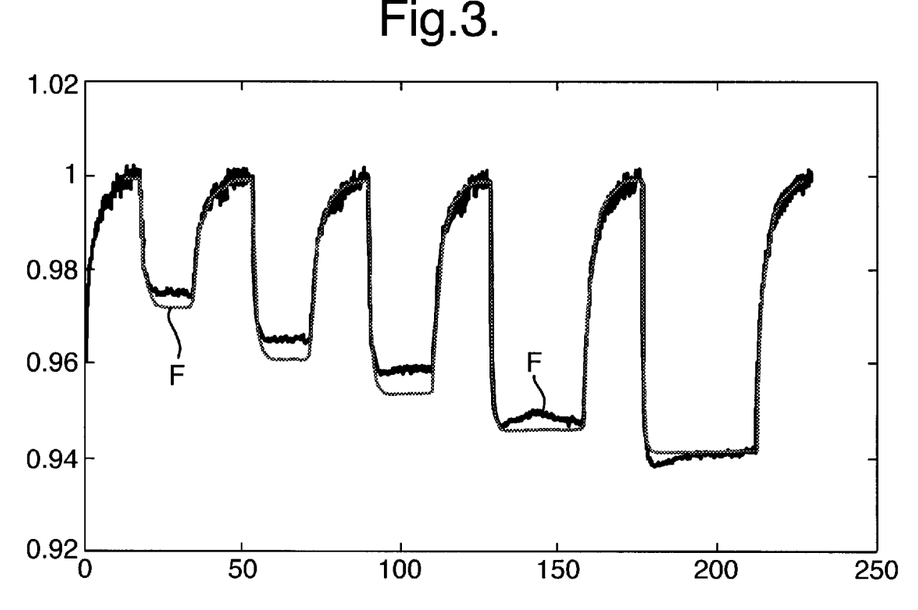
FIG. 3 corresponds substantially to the upper portion of FIG. 2, and additionally shows a fit to the experimental data on the basis of a predictive model developed by the inventors.

FIG. 3 corresponds to the upper portion of FIG. 2, and shows, in addition to the data of FIG. 2, a basic fit F to those data. The fit F is calculated on the basis of a model such as that presented in Embodiment 2, and matches the data closely. Any residual discrepancies between the fit F and the data can be reduced/removed using a more advanced (auto-calibration) procedure, e.g. as described in Embodiment 4.

Embodiment 6

Figure 4:
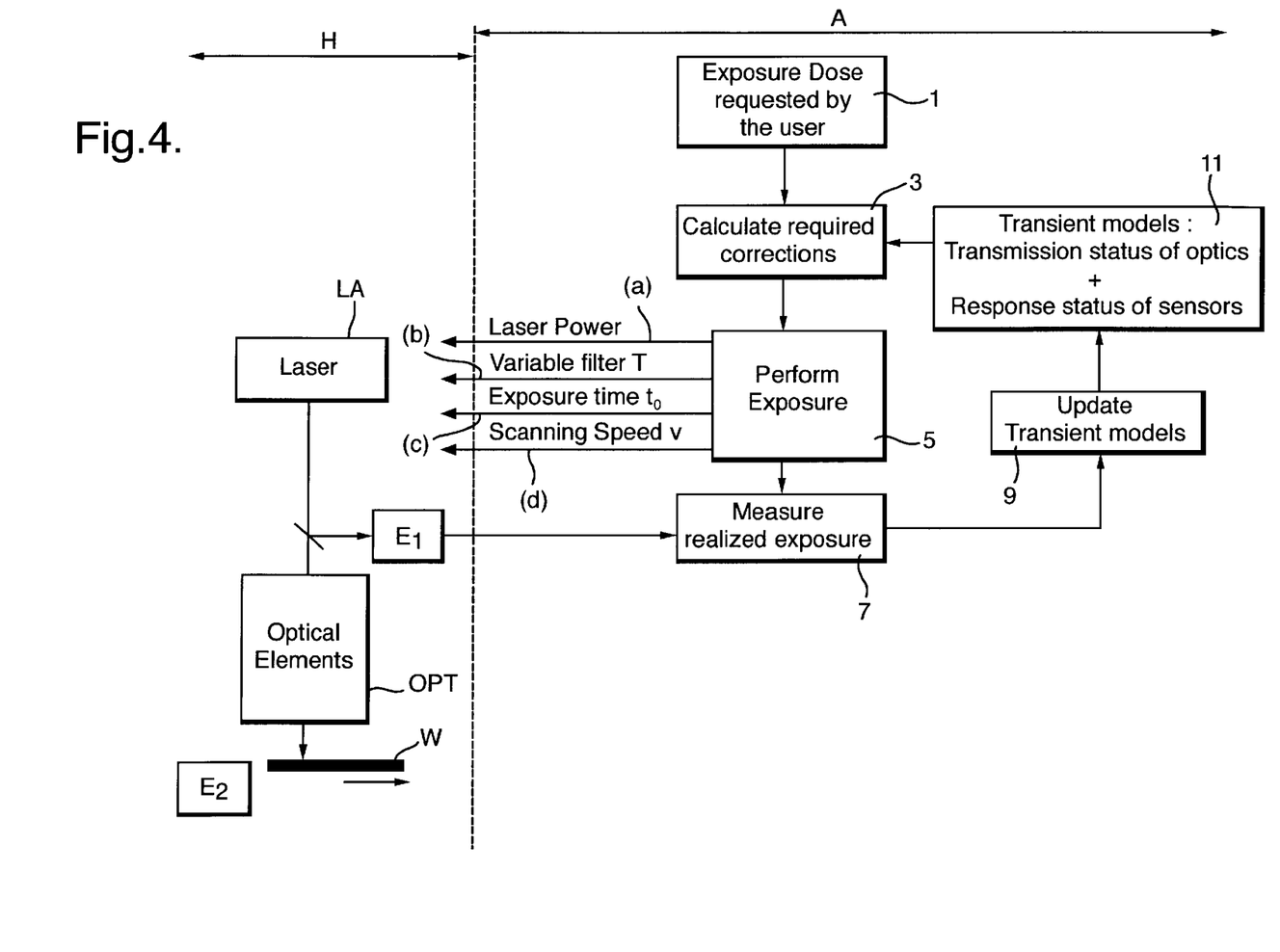
FIG. 4 shows a control schematic for performing the current invention.

FIG. 4 shows a control schematic for performing the current invention. The control schematic contains two main portions: a portion H showing various hardware elements of a lithographic projection apparatus, and a portion A representing a control algorithm and feedforward correction for use in portion H. In portion H, the radiation source (laser) LA, substrate W, and energy sensors $E_1$ and $E_2$ correspond to those depicted in FIG. 1. The item OPT schematically represents the various optical components between the sensors $E_1$ and $E_2$, and includes, for example, the items Ex, IN, CO and PL of FIG. 1, as well as their coatings.

The portion A of FIG. 4 will now be described in more detail.

Box 1 represents the exposure dose requested at the user interface of the device H.
 This exposure dose will be determined by factors such as the intrinsic power of the source LA, the resist sensitivity, the die size, etc.
 In Box 3, corrections are calculated on the basis of the inventors' mathematical model of transient effects (the "transient model").
 In Box 5, an exposure controller performs an exposure using the outcome of Box 3. The required exposure control may be effected by one or more of the methods (a) to (d) discussed previously in this text.

In Box 7, an output from the energy sensor $E_1$ is used to measure the realized exposure.

The output of Box 7 passes to Box 9, which performs an update of the transient model, if necessary (the "dynamic method" referred to already in this text).

The corrections from Box 9 are passed to Box 11, representing memory means for storing the transient model for use by Box 3.

Embodiment 7

Figure 5:
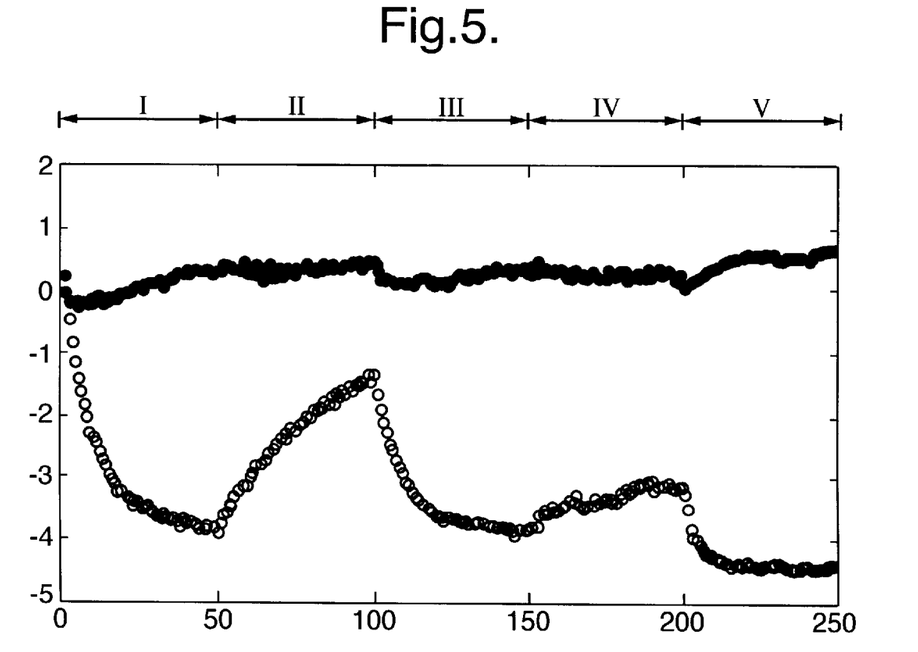
FIG. 5 shows the results of exposure sessions performed with the aid of the current invention, together with corresponding results performed without the aid of the current invention.

FIG. 5 shows the results of exposure sessions performed with the aid of the current invention (open circles), together with corresponding results performed without the aid of the current invention (closed discs). The Figure is a graph of Dose Error (in %) against Exposure Number, for the following exposure doses:

I: 20 mJ/cm$^2$

II: 2 mJ/cm$^2$

III: 20 mJ/cm$^2$

IV: 10 mJ/cm$^2$

V: 50 mJ/cm$^2$.

The numerals I–V are marked as sections in the graph.

It is clearly seen that, without the application of a corrective feedforward (lower curve, open circles), a large dose error occurs—amounting up to about 4.5%. However, the corresponding exposures performed using a corrective method according to the invention (upper curve, closed discs) show a very much smaller dose error—amounting to only about 0.5%.

What is claimed is:

1. A lithographic projection apparatus, comprising:
    a radiation system constructed and arranged to supply a projection beam of electromagnetic radiation having a wavelength of less than 200 nm;
    a mask table provided with a mask holder constructed and arranged to hold a mask;
    a substrate table provided with a substrate holder constructed and arranged to hold a substrate, said projection beam of electromagnetic radiation having an energy dose $D_s$ and an intensity $I_s$ at substrate level;
    a projection system constructed and arranged to image an irradiated portion of the mask onto a target portion of the substrate; and
    an energy controller constructed and arranged to maintain the energy dose $D_s$ at said substrate level at a substantially constant value by substantially compensating for irradiation-induced drift in the intensity $I_s$ at said substrate level.

2. An apparatus according to claim 1, wherein irradiation-induced drift in $I_s$ is substantially compensated by altering the intensity emerging from the radiation system.

3. An apparatus according to claim 1, wherein irradiation-induced drift in $I_s$ is substantially compensated with the aid of a variable filter interposed between the radiation system and the substrate.

4. An apparatus according to claim 1, wherein irradiation-induced drift in $I_s$ is counteracted by appropriate variation of the exposure time $t_e$, so as to keep $D_s$ substantially constant.

5. An apparatus according to claim 1, further comprising:
    first driving unit, constructed and arranged to move the mask table in a given reference direction parallel to the plane of the table;
    second driving unit, constructed and arranged to move the substrate table with a speed v parallel to the reference direction so as to be synchronous with the motion of the mask table,
    wherein irradiation-induced drift in $I_s$ is counteracted by appropriate variation of v, so as to keep $D_s$ substantially constant.

6. An apparatus according to claim 1, wherein the wavelength of the electromagnetic radiation is 193±5 nm.

7. An apparatus according to claim 1, wherein the irradiation-induced drift in $I_s$ is compensated with the aid of a feedforward control circuit.

8. A lithographic projection apparatus, comprising:
    a radiation system constructed and arranged to supply a projection beam of electromagnetic radiation having a wavelength of less than 200 nm;
    a mask table provided with a mask holder constructed and arranged to hold a mask;
    a substrate table provided with a substrate holder constructed and arranged to hold a substrate, said projection beam of electromagnetic radiation having an energy dose $D_s$ and a intensity $I_s$ at substrate level;
    a projection system constructed and arranged to image an irradiated portion of the mask onto a target portion of the substrate; and
    an energy controller constructed and arranged to maintain the energy dose $D_s$ at said substrate level at a substantially constant value by substantially compensating for irradiation- induced drift in the intensity $I_s$ at said substrate level;
    wherein the apparatus comprises a component constructed and arranged to determine the momentary optical transmission T along the irradiation path, on the basis of a model characterizing the resultant reaction to irradiation of the transmissive and/or reflective optical components along that path.

9. An apparatus according to claim 8, wherein the apparatus comprises a component constructed and arranged to determine T at a given instant, to compare the determined value of T with the predicted value of T derived from the model, and to adjust the correction to $D_s$ to compensate for a possible discrepancy between said determined and predicted values of T.

10. A lithographic projection apparatus, comprising:
    a radiation system constructed and arranged to supply a projection beam of electromagnetic radiation having a wavelength of less than 200 nm;
    a mask table provided with a mask holder constructed and arranged to hold a mask;
    a substrate table provided with a substrate holder constructed and arranged to hold a substrate, said projection beam of electromagnetic radiation having an energy dose $D_s$ and an intensity $I_s$ at substrate level;
    a projection system constructed and arranged to image an irradiated portion of the mask onto a target portion of the substrate; and
    an energy controller constructed and arranged to maintain the energy dose $D_s$ at said substrate level at a substantially constant value by substantially compensating for irradiation-induced drift in the intensity $I_s$ at said substrate level, and further comprising at least one energy sensor to monitor the intensity of radiation at one or more points in the path of the projection beam,
    wherein the apparatus comprises a component constructed and arranged to determine the momentary sensitivity of the energy sensor, on the basis of a model characterizing the reaction to irradiation of the energy sensor.

11. A device manufacturing method. comprising providing a substrate which is at least partially covered by a layer of radiation-sensitive material;

providing a mask which contains a pattern;

using a projection beam of electromagnetic radiation having a wavelength of less than 200 nm to project an image of at least part of the mask pattern onto a target area of the layer of radiation-sensitive material; and during projection, maintaining the energy dose $D_s$ at substrate level at a substantially constant value by substantially compensating for irradiation-induced drift in the intensity $I_s$ at said substrate level.

12. A device manufactured using a method as claimed in claim 11.

* * * * *

UNITED STATES PATENT AND TRADEMARK OFFICE
CERTIFICATE OF CORRECTION

PATENT NO. : 6,455,862 B1  Page 1 of 1
DATED : September 24, 2002
INVENTOR(S) : Paul van der Veen et al.

It is certified that error appears in the above-identified patent and that said Letters Patent is hereby corrected as shown below:

<u>Title page,</u>
Item [56], References Cited, U.S. PATENT DOCUMENTS, insert:

-- 5,846,678 A   12/1998   Nishigori, *et al.*   430/30
   5,914, 773 A   06/1999   Kurosawa, *et al.*   355/53 --
FOREIGN PATENT DOCUMENTS, insert:

-- EP   0 833 193 A2   04/1998
   WO   98/48452 A   10/1998 --

Signed and Sealed this

Seventh Day of September, 2004

JON W. DUDAS
*Director of the United States Patent and Trademark Office*

UNITED STATES PATENT AND TRADEMARK OFFICE
CERTIFICATE OF CORRECTION

PATENT NO. : 6,455,862 B1
DATED : September 24, 2002
INVENTOR(S) : Van Der Veen et al.

It is certified that error appears in the above-identified patent and that said Letters Patent is hereby corrected as shown below:

<u>Title page,</u>
Item [56], References Cited, FOREIGN PATENT DOCUMENTS,
insert -- JP    09007926  A    01/1997 --.

Signed and Sealed this

Thirtieth Day of May, 2006

JON W. DUDAS
*Director of the United States Patent and Trademark Office*